United States Patent [19]

Nohara

[11] Patent Number: 5,148,055
[45] Date of Patent: Sep. 15, 1992

[54] HOLDING CIRCUIT FOR PROVIDING A LARGE TIME CONSTANT BY USING A BASE CURRENT TO CHARGE THE CAPACITOR

[75] Inventor: Kazunori Nohara, Osaka, Japan

[73] Assignee: Sanyo Electric Co., Ltd, Moriguchi, Japan

[21] Appl. No.: 794,143

[22] Filed: Nov. 19, 1991

[30] Foreign Application Priority Data

Nov. 19, 1990 [JP]   Japan .................................. 2-313472
Nov. 9, 1991 [JP]   Japan .................................. 3-344175

[51] Int. Cl.$^5$ ...................... H03K 5/159; H03K 5/153
[52] U.S. Cl. .............................. 307/353; 307/362; 307/603
[58] Field of Search ............... 307/362, 352, 353, 600, 307/601, 603

[56] References Cited

U.S. PATENT DOCUMENTS 4,806,790   2/1989   Sone ................................. 307/353

FOREIGN PATENT DOCUMENTS 64-78008   3/1989   Japan .

Primary Examiner—Stanley D. Miller
Assistant Examiner—Sinh Tran
Attorney, Agent, or Firm—Armstrong & Kubovcik

[57] ABSTRACT

A holding circuit used in a pedestal level clamp circuit of a color television receiver. By using base current of a transistor as charging current of a capacitor, a large time constant is obtained. Also, in case the voltage lower than the reference voltage is held, base current of the transistor is used as discharging current to discharge slowly. Furthermore, though a charging transistor of the capacitor must be a PNP type and a discharging transistor must be an NPN type, it is designed not to be influenced by the difference in current amplification factors of the two types.

7 Claims, 6 Drawing Sheets

HOLDING CIRCUIT FOR PROVIDING A LARGE TIME CONSTANT BY USING A BASE CURRENT TO CHARGE THE CAPACITOR

BACKGROUND OF THE INVENTION

1. Field of the Invention

The present invention relates to a holding circuit used in a pedestal level clamp circuit of video signal of a color television.

2. Related Art of the Invention

A holding circuit has a configuration in which a capacitor is charged with signal to be held. In the case where this capacitor is built in an integrated circuit, since its capacitance can not be increased above a certain degree, various contrivances are necessary to improve holding characteristics.

FIG. 1 is a holding circuit disclosed in Japanese Patent Application Laid-Open No. 64-78008. In FIG. 1, reference numeral 31 designates a differential amplifier in which emitters of two NPN transistors, 14, 15 are commonly connected on the ground side, and these emitters are connected with a ground line via a transistor 16 and a resistance 17 for switching. Serial circuit of a resistance 20, a transistor 21 and a resistance 22 connected with a power terminal 24 is a constant-current circuit. Bases of the transistors 21 and 16 are connected and a transistor 19 is connected between these bases and the ground line. Clamping pulse is inputted to a base 23 of the transistor 19, and when the clamping pulse is "L", the transistor 16 is turned on. A reference voltage Vref is applied to the base of the transistor 15 from a d.c. power source 18. To the base of the transistor 14, for example, video signal of NTSC are given from a terminal 1 via a resistance 2. A capacitor 9 is charged from the power terminal 24 via a resistance 10 and a transistor 11. A collector of the transistor 14 is connected with a resistance 13, and the connecting point is given to the base of the transistor 11. Transistors 6, 5 and 3 are in Darlington connection, and a circuit connecting the base of the transistor 6 to the capacitor 9 is a discharge circuit. An emitter 5 of a transistor 3 in the final stage is connected with the ground line via a resistance 4, and a collector is connected with the connecting point of the resistance 2 and the transistor 14, the connecting point serving as an output terminal 50 of a holding circuit.

Since the pedestal level of the video signal inputted is higher than the reference voltage Vref, when the clamping pulse is given and the transistor 16 is ON, current flows through the transistor 14, thereby the transistor 11 is turned on and the capacitor 9 is charged by the collector current. On the other hand, when the transistor 16 is OFF, the capacitor 9 is discharged through the discharge circuit of the transistor 6 and so on. By repeating such operations, voltages of the transistor 14 base or the output terminal 50 becomes equal to the reference voltage Vref.

As such, in Japanese Patent Application Laid-Open No. 64-78008, since impedance of the discharge circuit is increased by composing the discharge circuit of three transistors connected in Darlington Connection, a discharge time constant is large enough to compensate insufficient capacitance of the capacitor.

In such a holding circuit, a large charge time constant is also desirable. Namely, it is desirable to become reference voltage Vref by a few number of H of the video signal. This is because that if it is held at 1 or 2 H, the clamp level fluctuates by noises and images are unstable. Therefore, it may be considered to increase the resistance value of the resistance 10 in a charging circuit, but the large resistance can not be controlled precisely in the integrated circuit.

As another method, it may be considered to lengthen the charging time by reducing collector current of the transistor 11. For this purpose, the resistance value of the resistance 17 may be increased to reduce the current flowing through the transistors 14, 16. However, if it is arranged in such a manner, the switching operation of the transistor 16 becomes unstable and an accurate holding operation can not be accomplished.

Meanwhile, there are other problems as to the discharging circuit. In the case where noises are superposed on a video signal, there are cases in which the base potential or output voltage of the transistor 14 may become lower than the reference voltage Vref. When the output voltage becomes lower than the reference voltage Vref as such, current does not flow to the transistor 14 side, and not only the capacitor 9 is not charged, potential rise of the output terminal 50 delays due to the high discharge time constant. Namely, when the charge time constant is small and susceptible to the influence of noises, the large discharge time constant may cause inconveniences.

FIG. 2 shows a circuit in which another discharge route is added to solve such problems. Serial circuit of transistors 25, 26 is connected between the power terminal 1 and the ground line, and a collector of the transistor 15 is connected with the transistor 25 base. To the transistor 26, a transistor 27 is connected with form a Miller circuit therewith, and a collector of the transistor 27 is connected with a terminal of the capacitor 9.

When such a circuit is provided, the transistors 25, 26 are turned on when the transistor 15 is ON, and current same as those flowing through the serial circuit flows to the transistor 27 and serves as a discharge current of the capacitor, thereby the problems may be solved for the time being but the holding voltage fluctuates relatively violently, and when used in a pedestal clamp circuit, the stability of images is spoiled.

SUMMARY OF THE INVENTION

It is a first object of the present invention to provide a holding circuit, in which a charge time constant is substantially raised by including a circuit configuration wherein base current being considerably smaller as compared with collector current is used as the charging current of a capacitor.

It is a second object of the present invention to provide a holding circuit, in which inconveniences in the case where the voltage to be held is lower than the reference voltage are solved.

It is a third object of the present invention to solve inconveniences in the case where PNP transistors and NPN transistors are used together.

It is a fourth object of the present invention to solve inconveniences due to differences in individual transistor characteristics.

The above and further objects and features of the invention will more fully be apparent from the following detailed description with accompanying drawings.

DESCRIPTION OF THE PREFERRED EMBODIMENT

Figure 3:
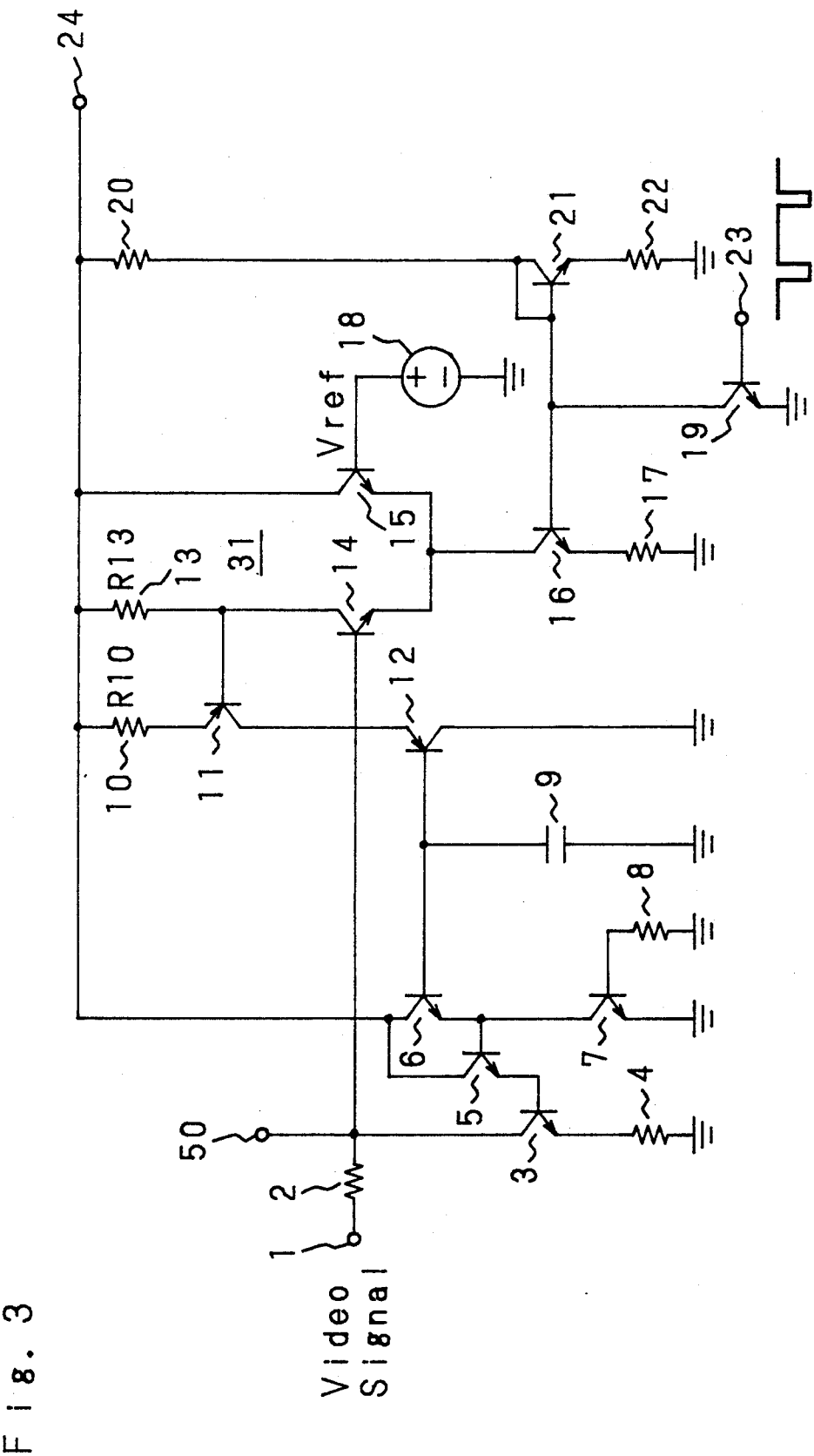
FIG. 3 is a circuit diagram of a first embodiment of the present invention.

FIG. 3 is a circuit diagram of a first embodiment of the present invention. In FIG. 3, reference numeral 31 designates a differential amplifier, and emitters of two NPN transistors 14, 15 are connected commonly. These emitters are connected with a ground line via an NPN transistor 16 for switching and a resistance 17. Serial circuit of a resistance 20, and NPN transistor 21 and a resistance 22 connected with a power terminal 24 is a constant-current circuit. Bases of the transistors 21, 16 are connected and between these bases and the ground line, an NPN transistor 19 is connected. Clamping pulse is inputted to a base 23 of the transistor 19, and the transistor 16 is turned on when this is "L". To the transistor 15 base, the reference voltage Vref is applied from a d.c. power source 18. To the transistor 14 base, video signal of NTSC, for example, is given from a terminal 1 via a resistance 2. Between the power terminal 24 and the ground line, a serial circuit of a resistance 10 and PNP transistors 11, 12 is provided. The transistor 11 base is connected with a collector of the transistor 14, and a resistance 13 is connected between the connecting point and the power terminal 24. A capacitor 9 is connected between the transistor 12 base and the ground line, and is charged by base current of the transistor 12. NPN transistors 6, 5 and 3 are in Darlington connection, and a circuit connecting the transistor 6 base to the capacitor 9 is a discharge circuit. An emitter 5 of the transistor 3 in the final stage is connected with the ground line via a resistance 4, and a collector is connected with the connecting point of the resistance 2 and the transistor 14, the connecting point serving as an output terminal 50 of a holding circuit.

Next, the operation of the circuit will be described. It is different from the circuit of FIG. 1 in that, the capacitor 9 is not charged by collector current of the transistor 11 but by base current of the transistor 12 directed by the collector current.

Since a pedestal level of the video signal inputted is higher than the reference voltage Vref, current flows to the transistor 14 when the clamping pulse is applied and the transistor 16 is ON, thereby the transistor 11 as well as the transistor 12 are turned on. Collector currents of the transistors 11 and 12 are equal. When the collector current, emitter ground current amplification factor of the transistor 12 and base current thereof are denoted respectively as Ic, $\beta$ and Ib, the following equation is obtained:

$$Ib = Ic/(1+\beta) \approx Ic/\beta$$

Figure 1:
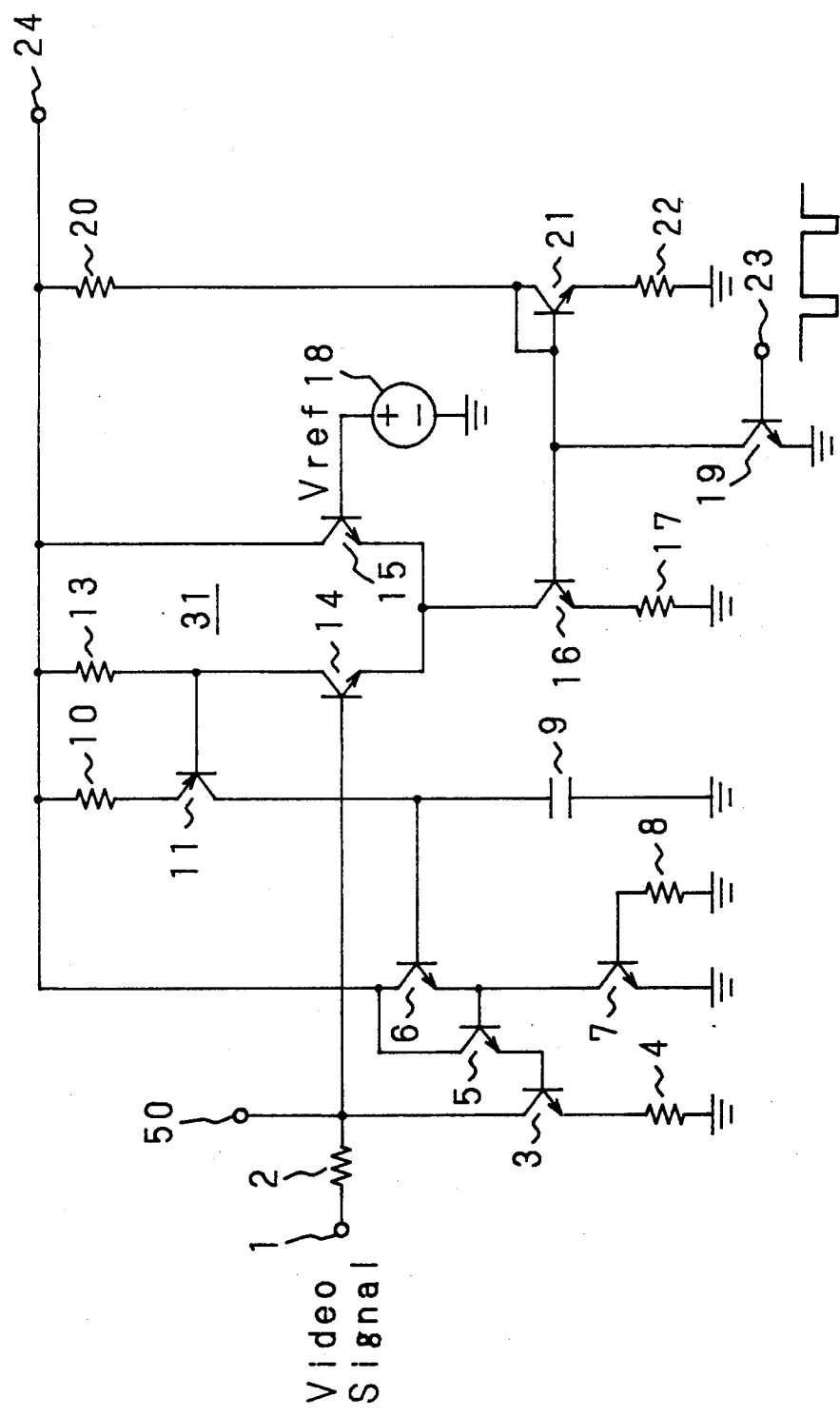
FIG. 1 is a circuit diagram of a conventional holding circuit.
Figure 2:
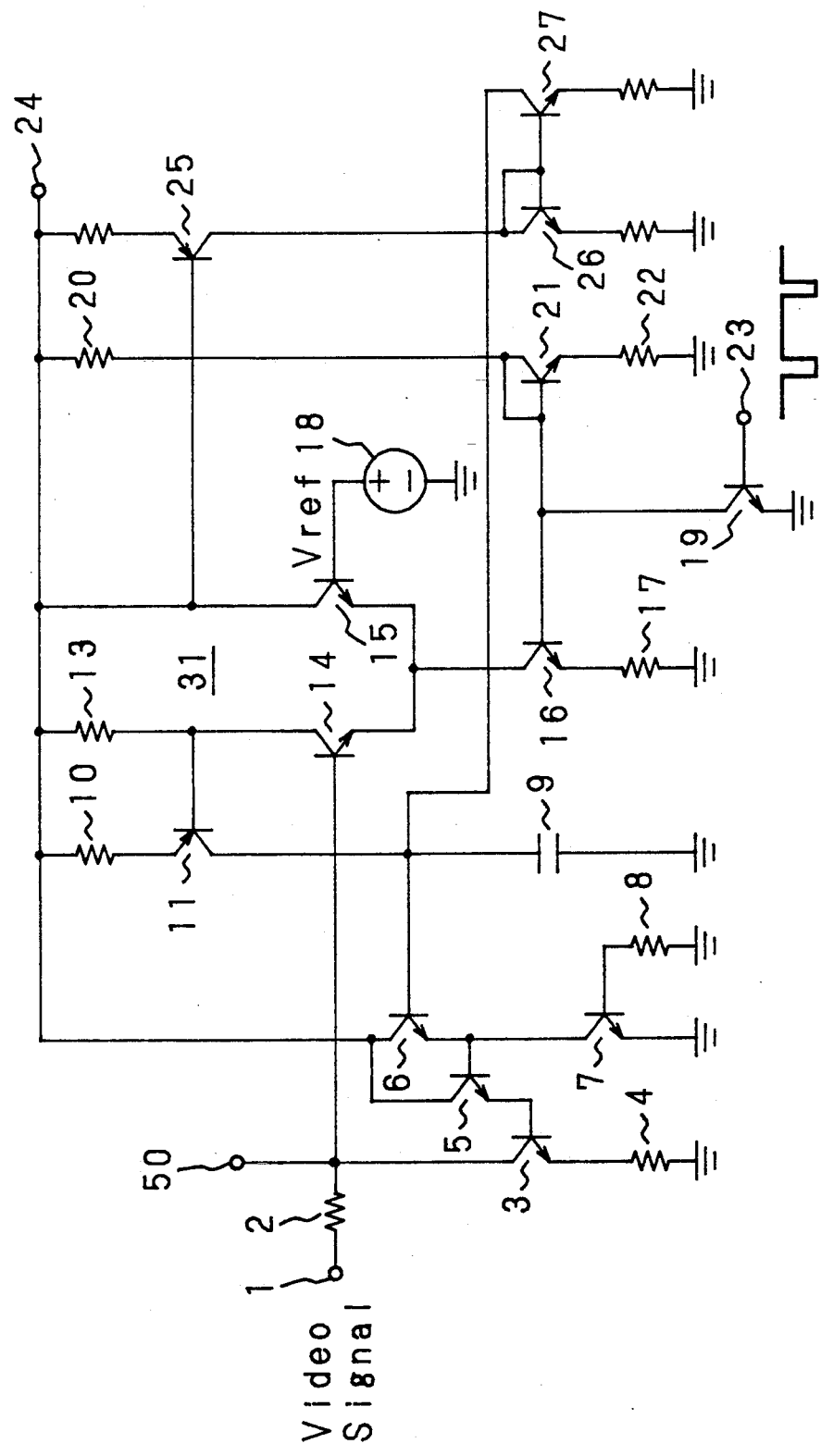
FIG. 2 is a circuit diagram of a conventional holding circuit having two discharging circuits.

Contrary to the circuits in FIGS. 1 and 2 where charging is effected by Ic, in the present invention, charging is effected by Ib. Assuming that $\beta$ takes a value of about 100, in this invention, charging current becomes smaller by that much and the charging time constant becomes larger. Thereby, it is possible to restrict influence of noises. Thus, when used in a pedestal level clamp circuit, stable images can be accomplished.

The capacitor 9 is discharged in the same manner as the conventional circuit shown in FIG. 1.

Figure 4:
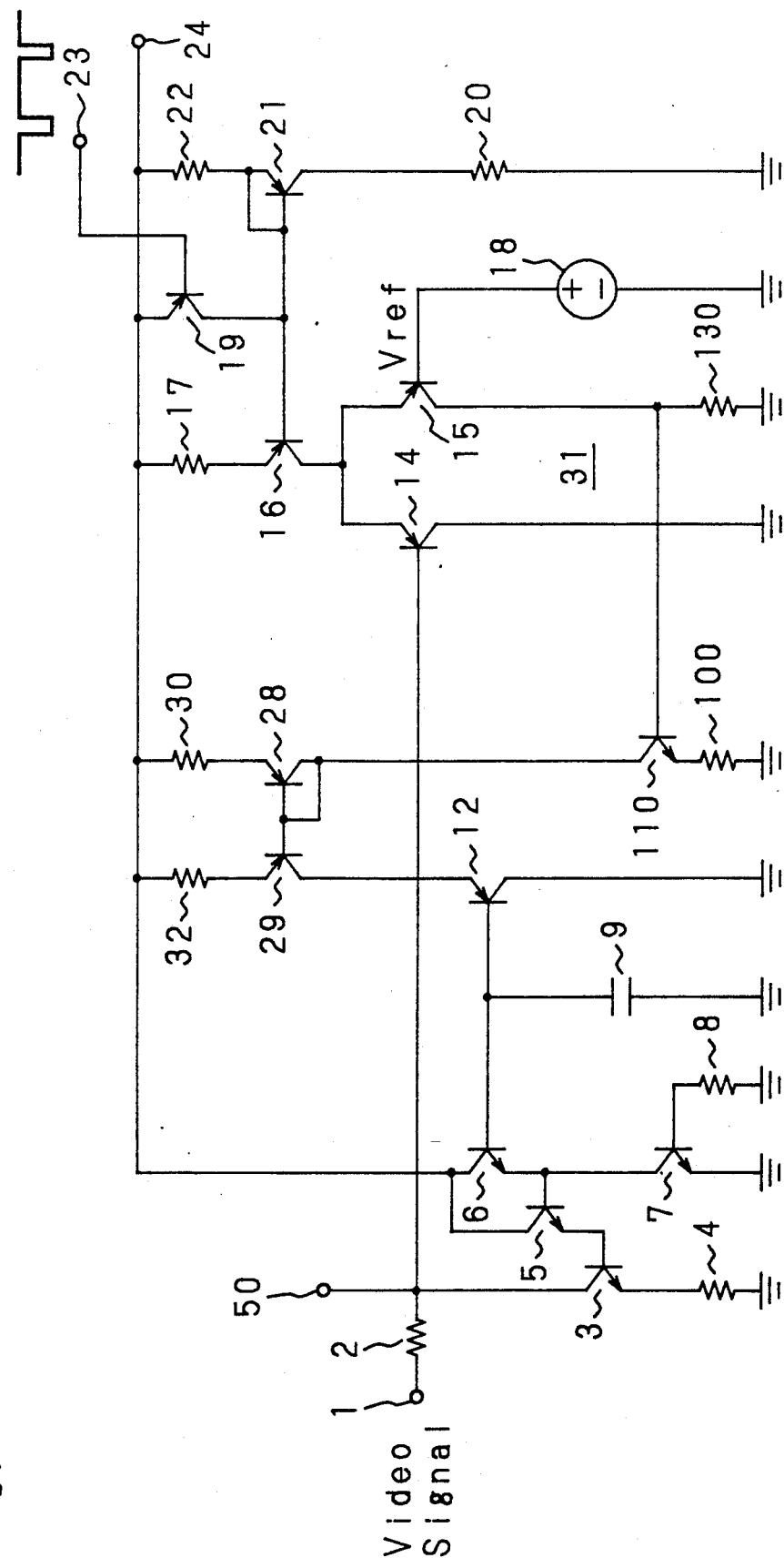
FIG. 4 is a circuit diagram of a second embodiment of the present invention.

FIG. 4 shows a differential amplifier 31 which is constituted by PNP transistors 14, 15. Emitters of the transistors 14, 15 are connected commonly and connected with a power terminal 24 via a PNP transistor 16 and a resistance 17. A collector of the transistor 15 to which the reference voltage is applied is connected with the ground line via a resistance 130.

With connecting point of the resistance with the collector of the transistor 15, the base of an NPN transistor 110 is connected, and an emitter of the transistor 110 is connected with the ground line via a resistance 100. A collector of the transistor 110 is connected with the power terminal 24 via a PNP transistor 28 and a resistance 30. A serial circuit of a PNP transistor 29 and a resistance 32 is connected with a serial circuit of the transistor 28 and the resistance 30 to constitute a mirror circuit, and a collector of the transistor 29 is connected with an emitter of a PNP transistor 12. It is same as the circuit shown in FIG. 3 that the base of the transistor 12 is connected with the capacitor 9.

A discharge circuit is exactly as same as those shown in FIG. 3. Portions to which clamping pulse is inputted are all provided with the PNP transistors 19, 21 corresponding to the fact that the transistor 16 is a PNP transistor. These portions are designated by reference numerals corresponding to those in FIG. 3 and their explanation is omitted.

When the transistor 16 is turned on by the clamping pulse, the transistor 15 on the reference voltage Vref side and lower than the input signal level is turned on. Thereby, the transistor 110 is On and current equivalent to the collector current flows through the circuit of transistors 29 and 12. Thereby, current of $1/\beta$ of this current flows to the transistor 12 base and serves as the charging current of the capacitor 9.

Figure 5:
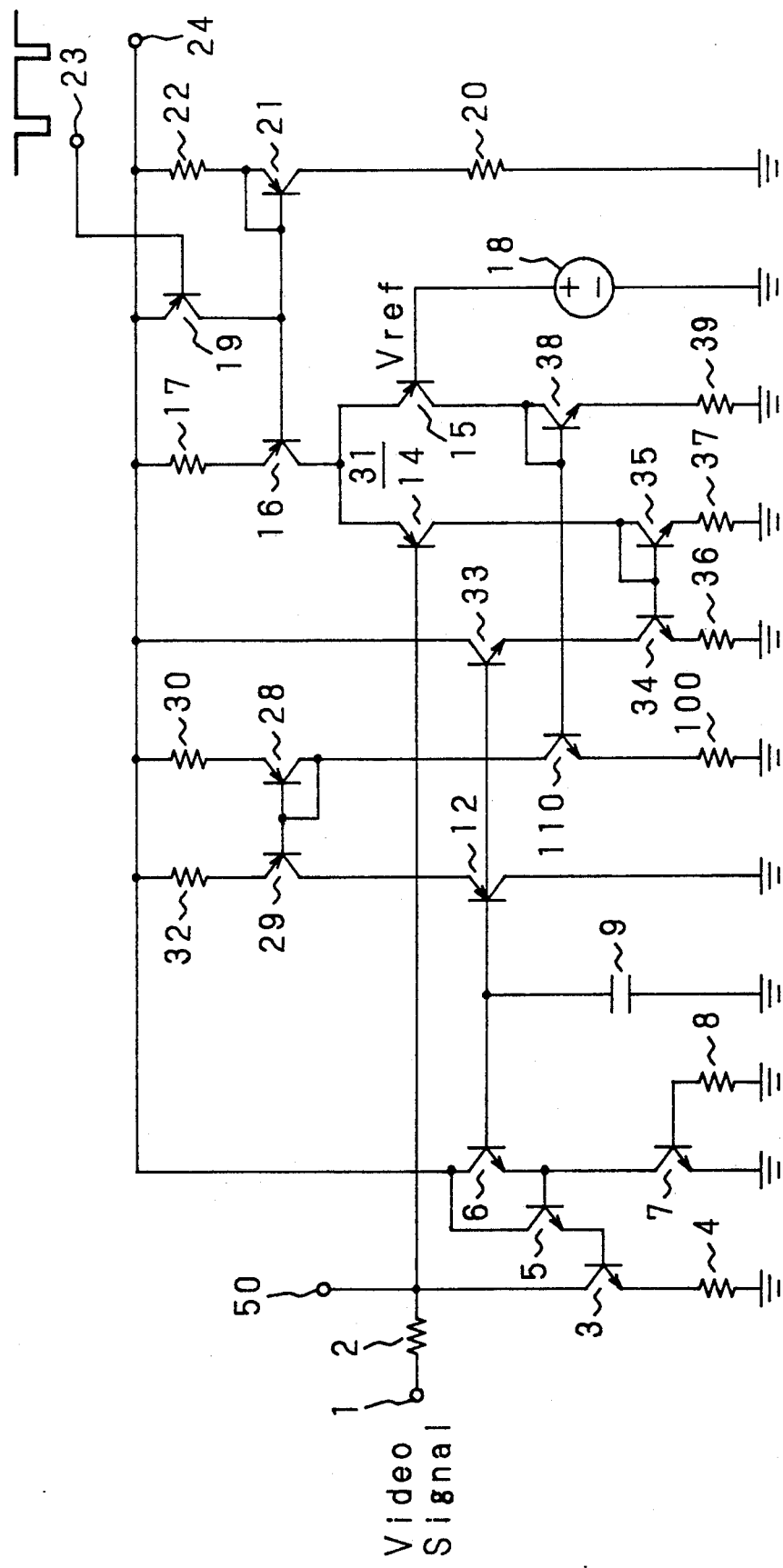
FIG. 5 is a circuit diagram of a third embodiment of the present invention.

FIG. 5 shows a third embodiment of the present invention, in which another discharge circuit is added to the second embodiment. A collector of the transistor 15 on the reference voltage input side is connected with the ground line via a serial circuit of an NPN transistor 38 and a resistance 39. This serial circuit is connected with a serial circuit of a transistor 110 and a resistance 100 to constitute a mirror circuit. A collector of the transistor 14 to which the voltage to be held is inputted is connected with the ground line via a serial circuit of an NPN transistor 35 and a resistance 37. This serial circuit is connected with a serial circuit of an NPN transistor 34 and a resistance 36 to constitute a mirror circuit. A collector of the transistor 34 is connected with an emitter of an NPN transistor 33. A collector of the transistor 33 is connected with the power terminal 24 and a base thereof is connected with the capacitor 9.

In the case where the input voltage to the differential amplifier 31 is higher than the reference voltage Vref, the transistors 15, 38 side are turned on and the equivalent current flows to the transistor 110. Conversely, in the case where the input voltage is lower, the transistors 14, 35 are turned on and the equivalent current flows to the transistors 33, 34. When collector current of the transistors 33, 34 and emitter ground current amplification factor of the transistor 33 are denoted respectively as Ic and $\beta$, base current of the transistor 33 becomes $Ic/\beta$.

Namely, in the third embodiment, in case of the low voltage input, though the capacitor 9 is discharged from the transistor 33 side, since it becomes discharge current of $1/\beta$ of the circuit of FIG. 2, the output voltage is restored gradually. Thus, when used in a pedestal clamp circuit, stability of images is improved.

Now, the circuit of FIG. 5 will be examined in detail. Correctly speaking, the differential amplifier 31 is not valanced when its two input voltages become equal, but is balanced in the state where charging and discharging currents of the capacitor 9 are equal. These currents are respectively base currents of the transistors 12, 33. These base currents are collector current of the transistor 12 itself or the transistor 110, and collector current of the transistor 33 itself or the transistor 34. Though circuits to the transistors 110, 34 are symmetrical on the transistors 14, 15 sides, the transistors 12, 33 are respectively the PNP and NPN type and in case of Ic, $\beta$ of two types do not coincide. Therefore, in the circuit of FIG. 5, some difference is generated between the charging and discharging currents and the output voltage is stabilized in the state having offset from the reference voltage.

Figure 6:
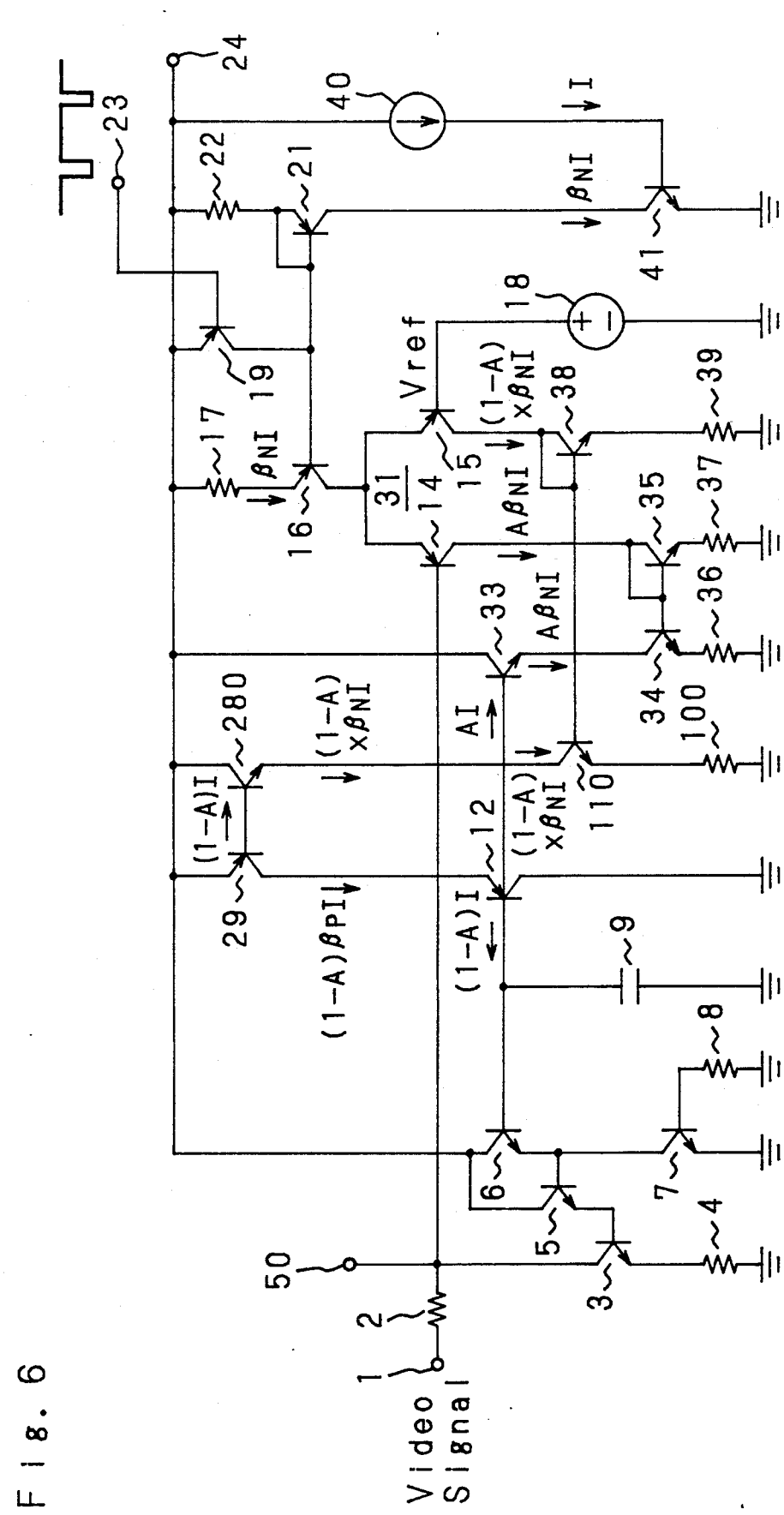
FIG. 6 is a circuit diagram of a fourth embodiment of the present invention.

FIG. 6 shows an embodiment in which such inconvenience has been solved. It is different from the circuit shown in FIG. 5 in that, in place of the PNP transistor 28 an NPN transistor 280 is used. In this embodiment, with a circuit of a resistance 22 and a transistor 21, which supplies constant current, an NPN transistor 41 is connected in series, and a micro-constant-current source 40 is connected with its base.

When current I is applied from the micro-constant-current source 40, collector current of $\beta NI$ flows through the transistor 41. $\beta N$ is an emitter ground current amplification factor of the NPN transistor. This current flows also to a transistor 21 which is in series with the transistor 41, and to a transistor 16 which constitutes a Miller circuit with the transistor 21. When the rate of current flowing to the transistor 14 side is A ($\leq 1$), currents flowing respectively through the transistors 14, 15 become $A\beta NI$ and $(1-A)\beta NI$. The current $(1-A) \beta NI$ flows also to a transistor 38 which is in series with the transistor 15, to a transistor 110 which constitutes a mirror circuit with the transistor 38 and further to a transistor 280 which is in series with the transistor 110.

Meanwhile, the current $A\beta NI$ flows also to a transistor 35 being in series with the transistor 14, to a transistor 36 constituting a mirror circuit with the transistor 35 and to a transistor 33 being in series with the transistor 36.

Base current of the transistor 280 is $1/\beta N$ of the collector current $(1-A)\beta NI$, thus it becomes $(1-A)I$. When $\beta P$ is an emitter ground current amplification factor of the PNP transistor, collector currents of the transistors 29, 12 become $(1-A)\beta P1$. Thus, base current of the transistor 12 or charging current of the capacitor 9 becomes $(1-A)I$.

On the other hand, since the collector current of the transistor 33 is $A\beta NI$ as stated above, its base current or discharging current of the capacitor 9 becomes AI.

In such an embodiment, since charging and discharging currents of the capacitor 9 are independent of the difference of amplification factor of the PNP and NPN transistors, A becomes roughly 0.5. Thus, the aforementioned problem of offset is solved. Furthermore, in this embodiment, since $\beta N$ and $\beta P$ are independent of the charging and discharging currents, variations in charging and discharging currents of individual IC are eliminated.

In the embodiment of FIG. 6, though the micro-constant-current source 40 and the transistor 41 are provided and current of the differential amplifier 31 is $\beta NI$, in the case where the constant-current circuit of the transistor 21 and the resistances 20, 22 are employed without the micro constant current source 40 and the transistor 41 as shown in FIGS. 4 and 5, when the current is Ic, current of the differential amplifier 31 also becomes Ic. Thus, according to the aforesaid description, the charging current becomes $(1-A)Ic/\beta N$ and the discharging current becomes $AIc/\beta N$. Here, though the problem of characteristic fluctuation of individual Ic due to variations in $\beta N$ may exist, the problem of offset due to difference according to amplification factor of the PNP and NPN transistors is solved.

A holding circuit of the present invention may be applied in an automatic gain control circuit and an automatic color control circuit of a color television.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A holding circuit, comprising:
    a differential amplifier in which a reference voltage is applied to a first input terminal and a voltage to be held is applied to a second input terminal;
    a first transistor whose conducting state is controlled by current which flows in response to a difference in two input voltages of the differential amplifier;
    a second transistor whose collector current is controlled by collector current of said first transistor wherein the collector currents of said transistors are approximately equal in magnitude;
    a capacitor connected with the base of said second transistor at one terminal and charged by the base current; and
    a discharge circuit connected with said one terminal of said capacitor.

2. A holding circuit as set forth in claim 1, wherein the differential amplifier includes NPN transistor pairs whose emitters are connected commonly, and the first and second transistors are PNP transistors.

3. A holding circuit as set forth in claim 1, wherein said differential amplifier includes PNP transistor pairs whose emitters are connected commonly, said first transistor is an NPN transistor and said second transistor is a PNP transistor, and collector currents of said first and second transistors are supplied by a current mirror circuit consisting of PNP transistor pairs.

4. A holding circuit as set forth in claim 3, further comprising a third transistor which is conductive when said voltage of said second input terminal is lower than said reference voltage,
    wherein said capacitor is connected with the base of said third transistor so as to be discharged through said third transistor.

5. A holding circuit as set forth in claim 4, wherein said third transistor is an NPN transistor.

6. A holding circuit as set forth in claim 5, wherein a mirror circuit is formed by a serial circuit of the first transistor and an NPN transistor and a serial circuit of the second transistor and a PNP transistor, by connecting the bases of the NPN transistors and the PNP transistors.

7. A holding circuit as set forth in claim 6, wherein current flowing through said differential amplifier has a value proportional to emitter ground current amplification factor of an NPN transistor.

* * * * *